US011211335B2

(12) United States Patent
Park et al.

(10) Patent No.: US 11,211,335 B2
(45) Date of Patent: Dec. 28, 2021

(54) SEMICONDUCTOR PACKAGES INCORPORATING ALTERNATING CONDUCTIVE BUMPS

(71) Applicant: Samsung Electronics Co., Ltd., Suwon-si (KR)

(72) Inventors: Yongjin Park, Anyang-si (KR); Jinsan Jung, Anyang-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/885,666

(22) Filed: May 28, 2020

(65) Prior Publication Data

US 2021/0118803 A1 Apr. 22, 2021

(30) Foreign Application Priority Data

Oct. 22, 2019 (KR) .................. 10-2019-0131415

(51) Int. Cl.
| | | |
|---|---|---|
| *H01L 23/538* | (2006.01) | |
| *H01L 25/065* | (2006.01) | |
| *H01L 23/31* | (2006.01) | |
| *H01L 23/00* | (2006.01) | |
| *H01L 23/488* | (2006.01) | |

(52) U.S. Cl.
CPC .......... *H01L 23/5384* (2013.01); *H01L 23/31* (2013.01); *H01L 23/488* (2013.01); *H01L 23/5386* (2013.01); *H01L 24/14* (2013.01); *H01L 25/0657* (2013.01)

(58) Field of Classification Search
CPC ... H01L 23/5384; H01L 23/31; H01L 23/488; H01L 23/5386; H01L 25/0657; H01L 24/14
See application file for complete search history.

(56) References Cited

U.S. PATENT DOCUMENTS

| | | |
|---|---|---|
| 7,312,529 B2 | 12/2007 | Clevenger et al. |
| 9,515,039 B2 | 12/2016 | Lai et al. |
| 9,530,746 B2 | 12/2016 | Kiyono et al. |
| 2013/0234324 A1 | 9/2013 | Cho et al. |
| 2014/0356986 A1 | 12/2014 | Clore et al. |
| 2017/0125973 A1 | 5/2017 | Gambino et al. |
| 2020/0395313 A1* | 12/2020 | Malli ................. H01L 23/5385 |

* cited by examiner

*Primary Examiner* — Quoc D Hoang
(74) *Attorney, Agent, or Firm* — Myers Bigel, P.A.

(57) ABSTRACT

A semiconductor package includes a first semiconductor chip having a plurality of first through-electrodes and a plurality of first upper connection pads respectively connected to the plurality of first through-electrodes, where the plurality of first upper connection pads are on an upper surface of the first semiconductor chip, a second semiconductor chip on the first semiconductor chip and having a plurality of second lower connection pads on a lower surface of the second semiconductor chip, and a plurality of connection members, each including a pillar and a conductive bump, the plurality of connection members electrically connecting respective ones of the first upper connection pads and the second lower connection pads to each other. Conductive bumps of adjacent connection members, among the plurality of connection members, are alternately disposed at different levels with respect to the upper surface of the first semiconductor chip.

20 Claims, 18 Drawing Sheets

SEMICONDUCTOR PACKAGES INCORPORATING ALTERNATING CONDUCTIVE BUMPS

CROSS-REFERENCE TO RELATED APPLICATION(S)

This application claims benefit of priority to Korean Patent Application No. 10-2019-0131415, filed on Oct. 22, 2019, in the Korean Intellectual Property Office, the disclosure of which is incorporated herein by reference in its entirety.

BACKGROUND

The present disclosure relates to a semiconductor package.

With rapid advances in the electronics industry and user demand, electronic devices have been miniaturized and have become lighter. Also, semiconductor packages used in the electronic devices not only benefit from being miniaturized and lightened but also from being highly efficient and having higher capacity. To this end, continuous research and development has been conducted into semiconductor chips including through-silicon vias (TSVs) and stacked semiconductor packages.

SUMMARY

Example embodiments provide semiconductor packages that have improved reliability and are capable of achieving miniaturization, high performance, and high capacity.

According to an example embodiment, a semiconductor package includes a first semiconductor chip having at least two first through-electrodes and at least two first upper connection pads that are respectively connected to the at least two first through-electrodes and that are on an upper surface of the first semiconductor chip, a second semiconductor chip on the first semiconductor chip and having at least two second lower connection pads on a lower surface of the second semiconductor chip, a first connection member between the first semiconductor chip and the second semiconductor chip and including a first pillar and a first conductive bump, the first connection member electrically connecting one of the at least two first upper connection pads and one of the at least two second lower connection pads to each other, and a second connection member that is adjacent the first connection member and including a second pillar and a second conductive bump, the second connection member electrically connecting another one of the at least two first upper connection pads and another one of the at least two second lower connection pads to each other. A first level of the first conductive bump and a second level of the second conductive bump are different.

According to an example embodiment, a semiconductor package includes a first semiconductor chip having a plurality of first through-electrodes and a plurality of first upper connection pads respectively connected to the plurality of first through-electrodes, where the plurality of first upper connection pads are on an upper surface of the first semiconductor chip, a second semiconductor chip on the first semiconductor chip and having a plurality of second lower connection pads on a lower surface of the second semiconductor chip, and a plurality of connection members, each including a pillar and a conductive bump, the plurality of connection members electrically connecting respective ones of the first upper connection pads and the second lower connection pads to each other. Conductive bumps of adjacent connection members, among the plurality of connection members, are alternately disposed at different levels with respect to the upper surface of the first semiconductor chip.

According to an example embodiment, a semiconductor package includes a first semiconductor chip having a first through-electrode, a first upper connection pad connected to the first through-electrode, a second through-electrode, and a second upper connection pad connected to the second through-electrode, wherein the first upper connection pad and the second upper connection pad are on an upper surface of the first semiconductor chip, a second semiconductor chip on the first semiconductor chip and having a first lower connection pad and a second lower connection pad on a lower surface of the second semiconductor chip, a first connection member including a first conductive bump having a lower surface facing the first semiconductor chip and an upper surface opposite the lower surface, a first auxiliary pillar on the lower surface of the first conductive bump and contacting the first upper connection pad, and a first pillar on the upper surface of the first conductive bump and contacting the first lower connection pad, a second connection member including a second conductive bump having a lower surface facing the first semiconductor chip and an upper surface opposite the lower surface, a second pillar on the lower surface of the second conductive bump and contacting the second upper connection pad, and a second auxiliary pillar on the upper surface of the second conductive bump and contacting the second lower connection pad, and an insulating layer between the first semiconductor chip and the second semiconductor chip and on the first connection member and the second connection member. The first conductive bump is at a level that is lower than a level of the second conductive bump.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments will be described with reference to the accompanying drawings. Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Figure 1:
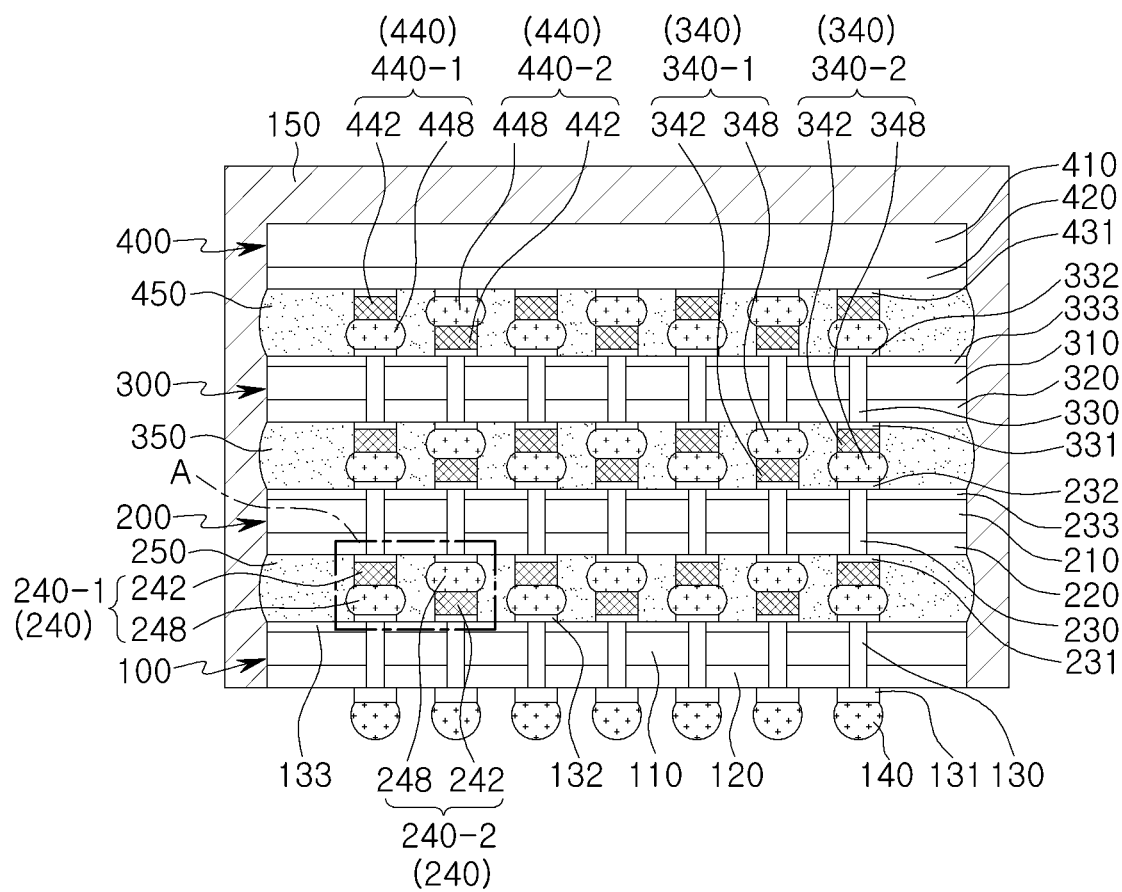
FIG. 1 is a cross-sectional view of a semiconductor package according to an example embodiment.

FIG. 1 is a cross-sectional view of a semiconductor package 1a according to an example embodiment.

Referring to FIG. 1, a semiconductor package 1a according to an example embodiment may include a first semiconductor chip 100, a second semiconductor chip 200, a third semiconductor chip 300, and a fourth semiconductor chip 400. The second to fourth semiconductor chips 200, 300, and 400 may be sequentially stacked on the first semiconductor chip 100. In addition, a plurality of connection members 140, 240, 340, and 440 may be respectively disposed between the first to fourth semiconductor chips 100, 200, 300, and 400 to be electrically connected to each other or to be electrically connected to a base die or a base substrate (for example, 600 in FIG. 9). In addition, the first to fourth semiconductor chips 100, 200, 300, and 400 may be attached to each other by insulating layers 250, 350, and 450, respectively disposed therebetween. It will be understood that, although the terms first, second, third, etc. may be used herein to describe various elements, the elements should not be limited by these terms; rather, these terms are only used to distinguish one element from another element. Thus, a first element discussed could be termed a second element without departing from the scope of the present inventive concepts.

For example, an external connection member 140 may be disposed below the first semiconductor chip 100, a lower connection member 240 may be disposed between the first semiconductor chip 100 and the second semiconductor chip 200, an intermediate connection member 340 may be disposed between the second semiconductor chip 200 and the third semiconductor chip 300, and an upper connection member 440 may be disposed between the third semiconductor chip 300 and the fourth semiconductor chip 400. The first to fourth semiconductor chips 100, 200, 300, and 400 may be electrically connected to each other through the lower connection member 240, the intermediate connection member 340, and the upper connection member 440, respectively disposed therebetween, and through-electrodes 130, 230, and 330 respectively disposed therein. The external connection member 140 may have a structure different from structures of the lower connection member 240, the intermediate connection member 340, and the upper connection member 440.

The lower connection member 240 may include a first lower connection member 240-1 and a second lower connection member 240-2 disposed adjacent to each other between the first semiconductor chip 100 and the second semiconductor chip 200. Each of the first and second lower connection members 240-1 and 240-2 may include a pillar 242 and a conductive bump 248 electrically connecting the first semiconductor chip 100 and the second semiconductor chip 200 to each other. The conductive bumps 248 of the first lower connection member 240-1 and the second lower connection member 240-2 may be disposed on different levels with respect to each other, and may be alternately disposed. Similarly, the intermediate connection member 340 may include a first intermediate connection member 340-1 and a second intermediate connection member 340-2, and the upper connection member 440 may include a first upper connection member 440-1 and a second upper connection member 440-2. Hereinafter, the above-described first lower, middle, and upper connection members 240-1, 340-1, and 440-1 will be described as a "first connection member," and the above-described second lower, intermediate, and upper connection members 240-2, 340-2, and 440-2 will be described as a "second connection member."

The first to fourth semiconductor chips 100, 200, 300, and 400 may be logic chips or memory chips. For example, all of the first to fourth semiconductor chips 100, 200, 300, and 400 may be the same type of memory chips, or a portion of the first to fourth semiconductor chips 100, 200, 300, and 400 may be a memory chip, and another portion thereof may be a logic chip.

The memory chip may be, for example, a volatile memory chip such as a dynamic random access memory (DRAM) or a static random access memory (SRAM), or a nonvolatile memory chip such as a phase-change random access memory (PRAM), a magnetoresistive random access memory (MRAM), a ferroelectric random access memory (FeRAM), or a resistive random access memory (RRAM). In example embodiments, each of the first to fourth semiconductor chips 100, 200, 300, and 400 may be a high-bandwidth memory (HBM) DRAM. In addition, the logic chip may be, for example, a microprocessor, an analog device, or a digital signal processor.

Although the semiconductor package 1a, in which the first to fourth semiconductor chips 100, 200, 300, and 400 are stacked, is illustrated as an example in FIG. 1, the number of semiconductor chips, stacked in the semiconductor package 1a, is not limited thereto. For example, two, three, or five or more semiconductor chips may be stacked in the semiconductor package 1a.

The first semiconductor chip 100 may include a first semiconductor substrate 110, a first semiconductor element layer 120, a first through-electrode 130, a first lower connection pad 131, and a first upper connection pad 132, and an external connection member 140.

The first semiconductor substrate 110 may have an upper surface and a lower surface opposing each other. The first semiconductor substrate 110 may include a first semiconductor element layer 120 formed on a lower surface side of the first semiconductor substrate 110. The first through-electrode 130 may penetrate through the first semiconductor substrate 110 and may extend from the upper surface of the first semiconductor substrate 110 toward the lower surface thereof, and may be connected to a first wiring structure, not illustrated, provided in the first semiconductor element layer 120 or may be directly connected to the lower connection pad 131 through the first semiconductor element layer 120. In some embodiments, the first lower connection pad 131, disposed on the first semiconductor element layer 120, may be electrically connected to the first through-electrode 130 through the wiring structure, not illustrated, in the first semiconductor element layer 120.

The first semiconductor substrate 110 may include, for example, silicon. In some embodiments, the first semiconductor substrate 110 may include a semiconductor element such as germanium or a compound semiconductor such as silicon carbide (SiC), gallium arsenide (GaAs), indium arsenide (InAs), and indium phosphide (InP). In some embodiments, the first semiconductor substrate 110 may have a silicon-on-insulator (SOI) structure. For example, the first semiconductor substrate 110 may include a buried oxide layer. The first semiconductor substrate 110 may have a conductive region, for example, a well doped with impurities or a structure doped with impurities. In addition, the first semiconductor substrate 110 may have various isolation structures such as a shallow trench isolation (STI) structure.

The first semiconductor element layer 120 may be formed to include a first wiring structure, not illustrated, for connecting a plurality of individual elements to other wirings formed in the first semiconductor substrate 110. The first wiring structure, not illustrated, may include a metal wiring layer and/or a via plug.

The first through-electrode 130 may extend from the upper surface of the first semiconductor substrate 110 toward the lower surface thereof, and may extend in and/or through the first semiconductor element layer 120. At least a portion of the first through-electrode 130 may have a pillar shape.

The first lower connection pad 131 may be disposed on the first semiconductor element layer 120, and may be electrically connected to a first wiring structure, not illustrated, in the first semiconductor element layer 120 or may be directly connected to the first through-electrode 130. The first lower connection pad 131 may include at least one of aluminum, copper, nickel, tungsten, platinum, and gold.

Although not illustrated in FIG. 1, a first lower passivation layer may be formed on the first semiconductor element layer 120 to protect a first wiring structure, not illustrated, in the first semiconductor element layer 120 and other structures below the first wiring structure from external impact or humidity. The first lower passivation layer may expose at least a portion of an upper surface of the first lower connection pad 131.

The first upper connection pad 132 may be disposed on the upper surface of the first semiconductor substrate 110 and may be electrically connected to the first through-electrode 130. The first upper connection pad 132 may include the same material as the first lower connection pad 131. In addition, a first upper passivation layer (or a first rear surface passivation layer) 133 may be formed on the upper surface of the first semiconductor substrate 110 to be on and/or cover the upper surface of the first semiconductor substrate 110 and to surround a portion of a side surface of the first through-electrode 130. It will be understood that "an element A surrounds an element B" (or similar language) as used herein means that the element A is at least partially around the element B but does not necessarily mean that the element A completely encloses the element B.

The external connection member 140 may be disposed on the first lower connection pad 131. The external connection member 140 may be used to electrically connect the semiconductor package 1a to an external base substrate (for example, 600 in FIG. 9). At least one of a control signal, a power signal, and a ground signal for operations of the first to fourth semiconductor chips 100, 200, 300, and 400 may receive a data signal to be stored in the first to fourth semiconductor chips 100, 200, 300, and 400 from an external entity or may provide data, stored in the first to fourth semiconductor chips 100, 200, 300, and 400, to the external entity. For example, the external connection member 140 may include a pillar, a ball structure, or a solder.

The second semiconductor chip 200 may be mounted on an upper surface of the first semiconductor chip 100. The second semiconductor chip 200 may be electrically connected to the first semiconductor chip 100 through the lower connection member 240 interposed between the upper surface of the first semiconductor chip 100 and a lower surface of the second semiconductor chip 200.

A first insulating layer 250 may be interposed between the lower surface of the second semiconductor chip 200 and the upper surface of the first semiconductor chip 100 to attach the second semiconductor chip 200 onto the first semiconductor chip 100. The first insulating layer 250 may protrude from side surfaces of the first semiconductor chip 100 and the second semiconductor chip 200 in a peripheral direction of the first semiconductor chip 100 and the second semiconductor chip 200. Further, although not illustrated in FIG. 1, a portion of the protruding first insulating layer 250 may be on and/or cover portions of the side surfaces of the first semiconductor chip 100 and the second semiconductor chip 200.

The third semiconductor chip 300 may be mounted on an upper surface of the second semiconductor chip 200, and may be electrically connected to the second semiconductor chip 200 through the intermediate connection member 340 interposed between the upper surface of the second semiconductor chip 200 and the lower surface of the third semiconductor chip 300. In addition, a second insulating layer 350 may be interposed between a lower surface of the third semiconductor chip 300 and an upper surface of the second semiconductor chip 200.

The fourth semiconductor chip 400 may be mounted on an upper surface of the third semiconductor chip 300, and may be electrically connected to the third semiconductor chip 300 through the upper connection member 440 interposed between the upper surface of the third semiconductor chip 300 and a lower surface of the fourth semiconductor chip. In addition, a third insulating layer 450 may be interposed between the lower surface of the fourth semiconductor chip 400 and the upper surface of the third semiconductor chip 300.

The second semiconductor chip 200 may include a second semiconductor substrate 210, a second semiconductor element layer 220, a second through-electrode 230, a second lower connection pad 231, and a second upper connection pad 232, a second upper passivation layer 233, and a lower connection member 240.

The third semiconductor chip 300 may include a third semiconductor substrate 310, a third semiconductor element layer 320, a third through-electrode 330, a third lower connection pad 331, a third upper connection pad 332, a third upper passivation layer 333, and an intermediate connection member 340.

The fourth semiconductor chip 400 may include a fourth semiconductor substrate 410, a fourth semiconductor element layer 420, a fourth lower connection pad 431, and an upper connection member 440. Unlike the first to third semiconductor chips 100, 200, and 300, the fourth semiconductor chip 400 may not have a through-electrode.

The lower connection member 240 may include a pillar 242 and a conductive bump 248. In the first lower connection member 240-1, the pillar 242 may be disposed above the conductive bump 248 (e.g., between the conductive bump 248 and the second semiconductor chip 200). In the second lower connection member 240-2, the pillar 242 may be disposed below the conductive bump 248 (e.g., between the conductive bump 248 and the first semiconductor chip 100). Accordingly, the conductive bumps 248 of the first and second connection members 240-1 and 240-2 may be disposed on different levels with respect to each other. Similarly, the intermediate connection member 340 and the upper connection member 440 may include first connection members 340-1 and 440-1 and second connection members 340-2 and 440-2, respectively. The term "pillar" used herein to describe, for example, a structure of a connection member such as lower connection member 240 is not intended to limit the shape of the structure. The pillar 242 can be any shape that extends between adjacent surfaces to contact one or more of the adjacent surfaces.

The first to third insulating layers 250, 350, and 450 (hereinafter, may be described as an "insulating layer") may be a non-conductive film (NCF), and may include an adhesive resin. The adhesive resin may be a thermosetting resin. For example, the adhesive resin may include at least one of a bisphenol type epoxy resin, a noblock type epoxy resin, a phenol resin, a urea resin, a melamine resin, an unsaturated polyester resin, and a resorcinol resin. The insulating layer may further include a flux in the non-conductive film (NCF) besides the adhesive resin. The flux may be classified into a resin-based flux, an organic-based flux, and an inorganic-based flux. A main flux, used in electronic devices, is a resin-based flux. Main materials of the resin-based flux may be, for example, rosin, modified rosin, a synthetic resin, and the like. A flux may be classified into a rosin activated (RA) rosin, a rosin mildly activated (RMA) flux, and a rosin (R) flux depending on the degree of activation.

Since the second to fourth semiconductor chips 200, 300, and 400 may have the same or similar technical features as the first semiconductor chip 100, detailed descriptions of the second to fourth semiconductor chips 200, 300, and 400 will be omitted.

The semiconductor package 1a may further include a molding member 150 on and/or surrounding side surfaces of the first to fourth semiconductor chips 100, 200, 300, and 400 and side surfaces of the first to third insulating layers 250, 350, and 450. In an example embodiment, the molding member 150 may be on and/or cover the upper surface of the fourth semiconductor chip 400, but is not limited thereto. In some embodiments, the molding member 150 may expose the upper surface of the fourth semiconductor chip 400 outwardly of the semiconductor package 1a. The molding member 150 may include, for example, an epoxy mold compound (EMC) or the like.

Figure 2:
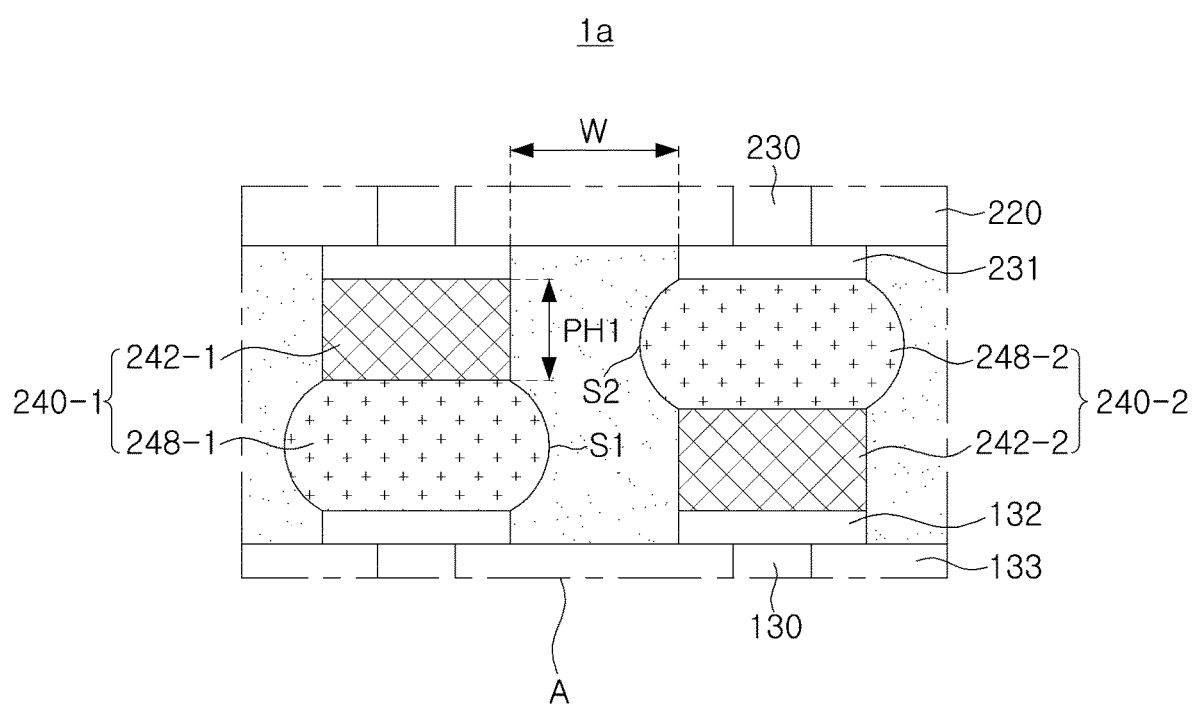
FIG. 2 is a partially enlarged view of region "A" in FIG. 1.

FIG. 2 is a partially enlarged view of region "A" in FIG. 1.

Referring to FIG. 2, in a first connection member 240-1, a first conductive bump 248-1 may be disposed on an upper surface of a first upper connection pad 132 and a pillar 242-1 may be disposed on an upper surface of the first conductive bump 248-1. On the other hand, in a second connection member 240-2, a second conductive bump 248-2 may be disposed on a lower surface of a second lower connection pad 231 and a second pillar 242-2 may be disposed on a lower surface of the second conductive bump 248-2.

For example, the semiconductor package 1a according to an example embodiment may include the first upper connection pad 132 disposed on the upper surface of the first semiconductor chip (100 in FIG. 1) and connected to a first through-electrode 130, the second lower connection pad 231 disposed on the lower surface of the second semiconductor chip (200 in FIG. 1) and connected to the second through-electrode 230, and first and second connection members 240-1 and 240-2 electrically connecting the first upper connection pad 132 and the second lower connection pad 231 to each other. The first connection member 240-1 may include a first conductive bump 248-1, disposed on an upper surface of the first upper connection pad 132, and a pillar 242-1 disposed on an upper surface of the first conductive bump 248-1, and the second connection member 240-2 may include a second conductive bump 248-2, disposed on a lower surface of the second lower connection pad 231, and a second pillar 242-2 disposed on a lower surface of the second conductive bump 248-2. Accordingly, the first conductive bumps 248-1 and the second conductive bumps 248-2 may be disposed on different levels with respect to each other.

The above-described first and second pillars may be collectively referred to as a pillar 242-1 and 242-2. The pillar 242-1 and 242-2 may have a height PH1 of 5 to 13 µm, a distance W between the pillar 242-1 and 242-2 (which may be referred to as a distance W between a first connection member and a second connection member) may be 18 µm or less or 8 µm or less. The pillar 242-1 and 242-2 may include, for example, nickel (Ni), copper (Cu), palladium (Pd), platinum (Pt), gold (Au), or combinations thereof. In an example embodiment, the pillars 242-1 and 242-2 may include copper (Cu) or a copper-alloy, but the inventive concepts of the present disclosure are not limited thereto.

In the case of a semiconductor package in which a plurality of semiconductor chips, including through-electrodes, are stacked to achieve miniaturization and high performance of an electronic device, fine-pitch conductive bumps, disposed adjacent to each other, are brought into contact with each other to cause a short-circuit in a reflow process or a thermal compression bonding process in which semiconductor chips are attached.

Since the semiconductor package according to the present disclosure includes the first conductive bumps 248-1 and the second conductive bumps 248-2 disposed on different levels with respect to each other, protrusions S1 and S2 of the first conductive bumps 248-1 and the second conductive bumps 248-2 may be alternately disposed to prevent a short circuit from occurring even when a conductive bump are transformed in a reflow process or a thermal compression bonding process.

Figure 3:
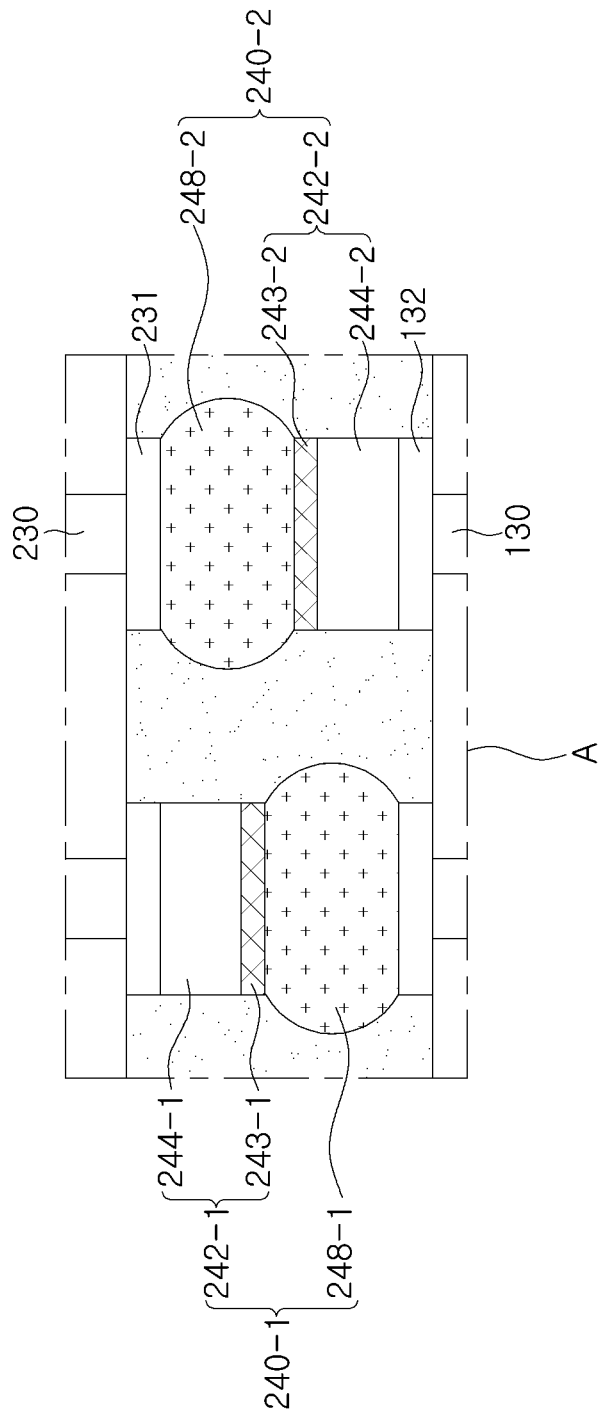
FIG. 3 is a partially enlarged schematic view of a portion of a semiconductor package according to an example embodiment.

FIG. 3 is a partially enlarged schematic view of a portion of a semiconductor package 1b according to an example embodiment. FIG. 3 is an enlarged view of a portion corresponding to FIG. 2. In FIG. 3, the same reference numerals as those in FIG. 2 denote the same components. The semiconductor package 1b according to FIG. 3 includes components similar to the components of the semiconductor package 1a described with reference to FIG. 1, except for the structure illustrated in FIG. 3.

Referring to FIG. 3, a first pillar 242-1 may include a first support layer 244-1, disposed to be in contact with a lower surface of a second lower connection pad 231, and a first contact layer 243-1 disposed to be in contact with a lower surface of the first support layer 244-1 and an upper surface of a first conductive bump 248-1. In addition, a second pillar 242-2 may include a second support layer 244-2, disposed to be in contact with an upper surface of a first upper connection pad 132, and a second contact layer 243-2 disposed to be in contact with an upper surface of the second support layer 244-2 and a lower surface of a second conductive bump 248-2.

The above-described first and second support layers 244-1 and 244-2 may be collectively referred to as a support layer 244-1 and 244-2. The support layer 244-1 and 244-2 may include, for example, nickel (Ni), copper (Cu), palladium (Pd), platinum (Pt), gold (Au), or combinations thereof. In example embodiments, the support layer 244-1 and 244-2 may include copper (Cu) or a copper-alloy, and thus, rigidity of the pillar 242-1 and 242-2, adjusting the level of the conductive bump 248-1 and 248-2, may be improved.

The above-described first and second contact layers 243-1 and 243-2 may be collectively referred to the contact layer 243-1 and 243-2. The contact layer 243-1 and 243-2 may include, for example, nickel (Ni), copper (Cu), palladium (Pd), platinum (Pt), Gold (Au), or combinations thereof. In example embodiments, the contact layer 243-1 and 243-2 may include nickel (Ni) or a nickel-alloy. Accordingly, excessive generation of an intermetallic compound, caused by reaction between the conductive bump 248-1 and 248-2 and the support layer 244-1 and 244-2, may be reduced and/or suppressed to prevent voids from being formed in the conductive bump 248-1 and 248-2 and to prevent the conductive bump 248-1 and 248-2 from extending to side surfaces of the support layer 244-1 and 244-2.

The conductive bump 248-1 and 248-2 may have a spherical or ball shape. The conductive bump 248-1 and 248-2 may include tin (Sn), indium (In), bismuth (Bi), antimony (Sb), copper (Cu), silver (Ag), zinc (Zn), lead (Pb), and/or alloys thereof.

Figure 4:
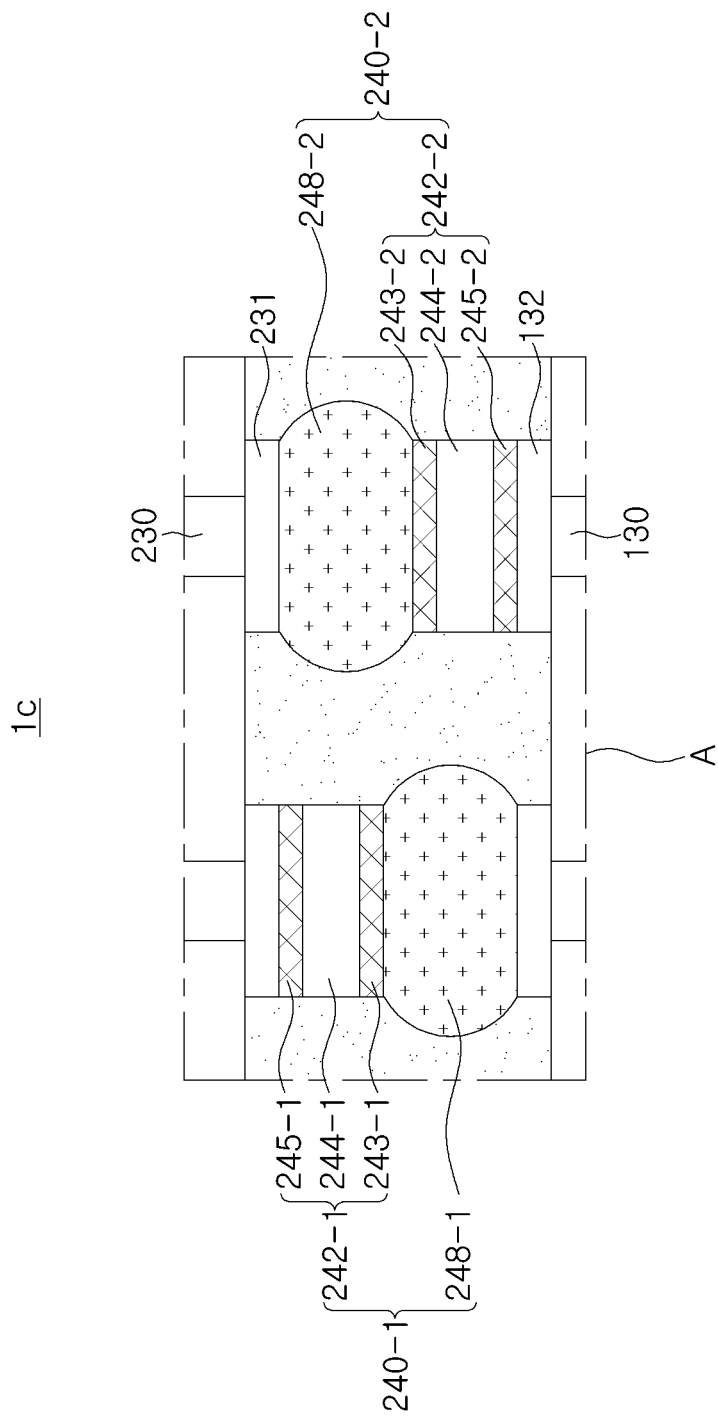
FIG. 4 is a partially enlarged schematic view of a portion of a semiconductor package according to an example embodiment.

FIG. 4 is a partially enlarged schematic view of a portion of a semiconductor package 1c according to an example embodiment. FIG. 4 is an enlarged view of a portion corresponding to FIG. 2. In FIG. 4, the same reference numerals as those in FIG. 2 denote the same components. The semiconductor package 1c according to FIG. 4 includes components similar to the components of the semiconductor package 1a described with reference to FIG. 1, except for the structure illustrated in FIG. 4.

Referring to FIG. 4, a first pillar 242-1 may include a first base layer 245-1 disposed to be in contact with a lower surface of a second lower connection pad 231, a first support layer 244-1 disposed to be in contact with a lower surface of the first base layer 245-1, and a first contact layer 243-1 disposed to be in contact with the a lower surface of the first support layer 244-1 and an upper surface of a first conductive bump 248-1. In addition, a second pillar 242-2 may include a second base layer 245-2 disposed to be in contact with an upper surface of a first upper connection pad 132, a second support layer 244-2 disposed to be in contact with an upper surface of the second base layer 245-2, and a second contact layer 243-2 disposed to be in contact with an upper surface of the support layer 244-2 and a lower surface of a second conductive bump 248-2.

The base layers 245-1 and 245-2 may form stable bonding between the support layers 244-1 and 244-2 and the connection pads 231 and 132. In example embodiments, the base layers 245-1 and 245-2 may include, for example, nickel (Ni), copper (Cu), palladium (Pd), cobalt (Co), platinum (Pt), gold (Au), and/or combinations thereof. For example, the base layers 245-1 and 245-2 may include nickel or an alloy of nickel, but the inventive concepts of the present disclosure are not limited thereto. Heights of the base layers 245-1 and 245-2 may be appropriately selected depending on compositions, heights, and the like of the support layers 244-1 and 244-2.

Figure 5:
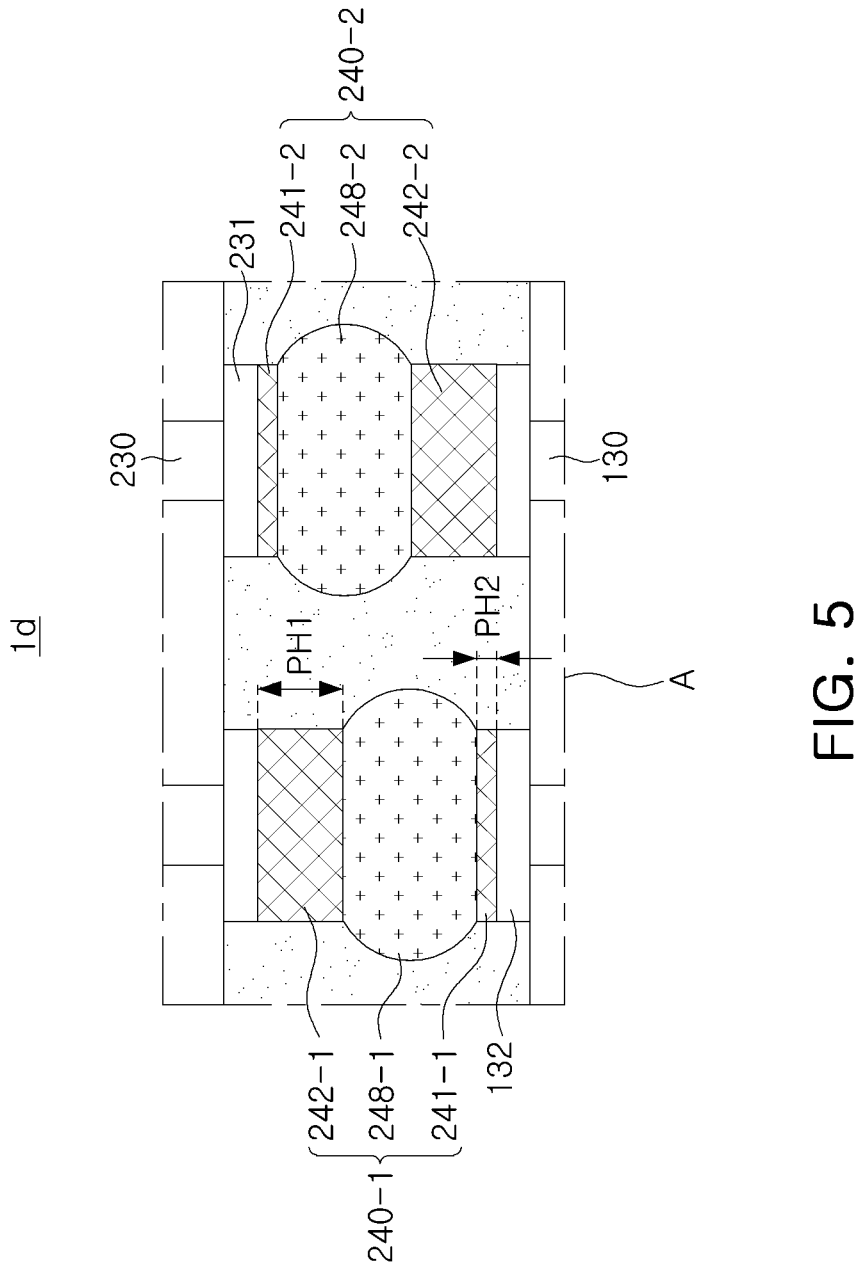
FIG. 5 is a partially enlarged schematic view of a portion of a semiconductor package according to an example embodiment.

FIG. 5 is a partially enlarged schematic view of a portion of a semiconductor package 1d according to an example embodiment. FIG. 5 is an enlarged view of a portion corresponding to FIG. 2. In FIG. 5, the same reference numerals as those in FIG. 2 denote the same components. The semiconductor package 1d according to FIG. 5 includes components similar to the components of the semiconductor package 1a described with reference to FIG. 1, except for the structure illustrated in FIG. 5.

Referring to FIG. 5, a first connection member 240-1 may include a first auxiliary pillar 241-1 disposed on an upper surface of a first upper connection pad 132 and disposed to be in contact with a lower surface of a first conductive bump 248-1, a first conductive bump 248-1 disposed to be in contact with an upper surface of the first auxiliary pillar 241-1, and a first pillar 242-1 disposed to be in contact with an upper surface of the first conductive bump 248-1 and a lower surface of a second lower connection pad 231. On the other hand, a second connection member 240-2 may include a second auxiliary pillar 241-2 disposed on the lower surface of the second lower connection pad 231 and disposed to be in contact with an upper surface of a second conductive bump 248-2, a second conductive bump 248-2 disposed to be in contact with a lower surface of the second auxiliary pillar 241-2, and a second pillar 242-2 disposed to be in contact with a lower surface of the second conductive bump 248-2 and the upper surface of the first upper connection pad 132.

For example, the first connection member 240-1 and the second connection member 240-2 may further include the auxiliary pillars 241-1 and 241-2 disposed to be opposite the pillars 242-1 and 242-2 with respect to the conductive bumps 248-1 and 248-2, respectively.

The auxiliary pillars 241-1 and 241-2 may include, for example, nickel (Ni), copper (Cu), palladium (Pd), platinum (Pt), gold (Au), and/or combinations thereof. In example embodiments, the auxiliary pillars 241-1 and 241-2 may include nickel (Ni) or a nickel-alloy. Accordingly, excessive generation of an intermetallic compound, caused by reaction between the conductive bumps 248-1 and 248-2 and the connection pads 132 and 231, may be reduced and/or suppressed to prevent voids from being formed in the conductive bumps 248-1 and 248-2.

A height PH2 of each of the auxiliary pillars 241-1 and 241-2 may be less than a height PH1 of each of the pillars 242-1 and 242-2. For example, the height PH2 of each of the auxiliary pillar 241-1 and 241-2 may be approximately 1 to 3 μm.

Figure 6:
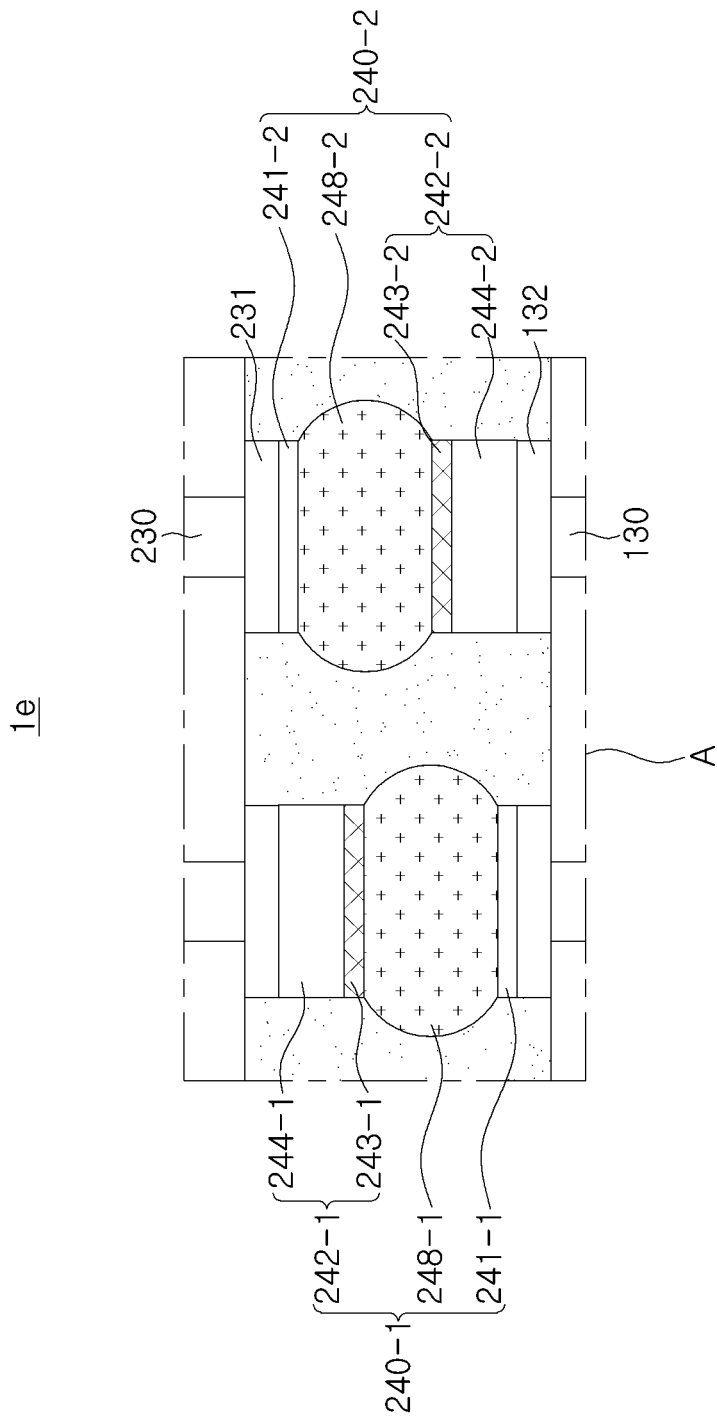
FIG. 6 is a partially enlarged schematic view of a portion of a semiconductor package according to an example embodiment.

FIG. 6 is a partially enlarged schematic view of a portion of a semiconductor package 1e according to an example embodiment. FIG. 6 is an enlarged view of a portion corresponding to FIG. 2. In FIG. 6, the same reference numerals as those in FIG. 2 denote the same components. The semiconductor package 1e according to FIG. 6 includes components similar to the components of the semiconductor package 1a described with reference to FIG. 1, except for the structure illustrated in FIG. 6.

Referring to FIG. 6, a first connection member 240-1 may include a first auxiliary pillar 241-1, disposed on a lower surface of a first conductive bump 248-1, and a first pillar 242-1 disposed to be in contact with an upper surface of the first conductive bump 248-1. The first pillar 242-1 may include a first support layer 244-1, disposed to be in contact with a lower surface of a second lower connection pad 231, and a first contact layer 243-1 disposed on a lower surface of the first support layer 244-1 and the upper surface of the first conductive bump 248-1. A second connection member 240-2 may include a second auxiliary pillar 241-2, disposed to be in contact with an upper surface of a second conductive bump 248-2, and a second pillar 242-2 disposed to be in contact with a lower surface of the second conductive bump 248-2. The second pillar 242-2 may include a second support layer 244-2, disposed to be in contact with an upper surface of a first upper connection pad 132, and a second contact layer 243-2 disposed to be in contact with an upper surface of the second support layer 244-2 and a lower surface of the second conductive bump 248-2.

Since technical features of the contact layers 243-1 and 243-2 and the support layers 244-1 and 244-2 are the same and/or similar as described with reference to FIG. 3, descriptions thereof will be omitted.

Figure 7:
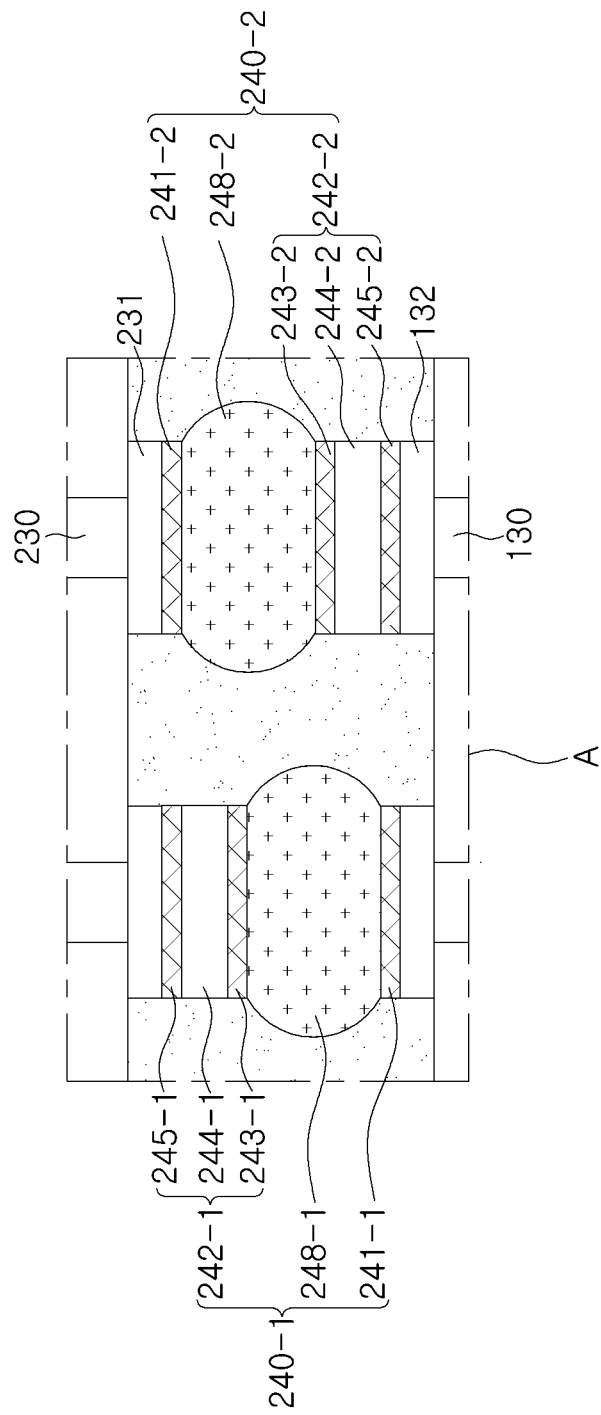
FIG. 7 is a partially enlarged schematic view of a portion of a semiconductor package according to an example embodiment.

FIG. 7 is a partially enlarged schematic view of a portion of a semiconductor package 1f according to an example embodiment. FIG. 7 is an enlarged view of a portion corresponding to FIG. 2. In FIG. 7, the same reference numerals as those in FIG. 2 denote the same components. The semiconductor package 1f according to FIG. 7 includes components similar to the components of the semiconductor package 1a described with reference to FIG. 1, except for the structure illustrated in FIG. 7.

Referring to FIG. 7, a first connection member 240-1 may include a first auxiliary pillar 241-1, disposed to be in contact with a lower surface of the first conductive bump 248-1, and a first pillar 242-1 disposed to be in contact with an upper surface of the first conductive bump 248-1. The first pillar 242-1 may include a first base layer 245-1, disposed to be in contact with a lower surface of a second lower connection pad 231, a first support layer 244-1 disposed to be in contact with a lower surface of the first base layer 245-1, and a first contact layer 243-1 disposed to be in contact with a lower surface of the first support layer 244-1 and an upper surface of the first conductive bump 248-1.

A second connection member 240-2 may include a second auxiliary pillar 241-2, disposed to be in contact with an upper surface of a second conductive bump 248-2, and a second pillar 242-2 disposed to be in contact with a lower surface of the second conductive bump 248-2. The second pillar 242-2 may include a second base layer 245-2 disposed to be in contact with an upper surface of a first upper connection pad 132, a second support layer 244-2 disposed to be in contact with an upper surface of the second base layer 245-2, and a second contact layer 243-2 disposed to be in contact with an upper surface of the second support layer 244-2 and a lower surface of the second conductive bump 248-2.

Since technical features of the contact layers 243-1 and 243-2 and the support layers 244-1 and 244-2 are the same as described with reference to FIG. 4, descriptions thereof will be omitted.

Figure 8:
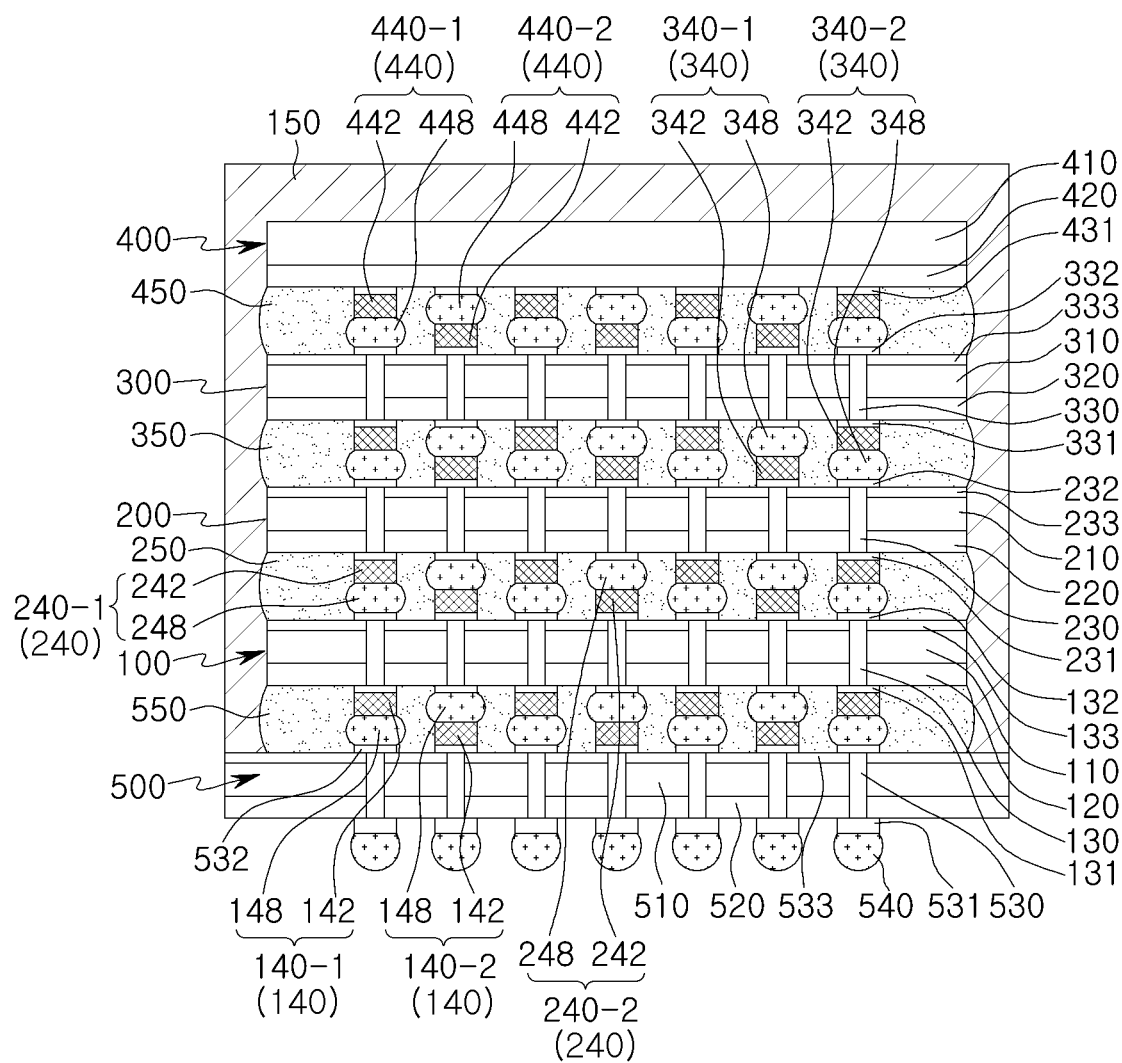
FIG. 8 is a cross-sectional view of a semiconductor package according to an example embodiment.

FIG. 8 is a cross-sectional view of a semiconductor package 2a according to an example embodiment.

Referring to FIG. 8, the semiconductor package 2a according to an example embodiment may include a base die 500. The base die 500 may include a base die substrate 510, an interlayer insulating layer 520, a base through-electrode 530, a base connection pad 531, a base upper connection pad 532, and a rear surface passivation layer 533. The base through-electrode 530 may penetrate from a lower surface to an upper surface of the base die substrate 510 and may extend in and/or through the interlayer insulating layer 520. A plurality of wiring structures, not illustrated, may be formed in the interlayer insulating layer 520, and may be electrically connected to the base through-electrode 530.

A base connection member 540 may be mounted on a lower surface of the base die 500. The base connection member 540 may be disposed on a base connection pad 531 disposed on a lower surface of the base die 500. The technical features of the base connection member 540 are similar to those of the external connection member 140 in FIG. 1. In addition, the first and second external connection members 140-1 and 140-2, connecting the first semiconductor chip 100 and the base die 500 to each other, have the same structure as the above-described first and second connection members (e.g., 240-1, 240-2, etc.).

First to fourth semiconductor chips 100, 200, 300, and 400 may be stacked on the upper surface of the base die 500 in an upward direction of the base die 500. An external connection member 140 may be interposed between a base upper connection pad 532 on an upper surface of the base die 500 and a first lower connection pad 131 on a lower surface of the first semiconductor chip 100. The external connection member 140 may have technical features similar to those of the second to fourth connection members 240, 340, and 440.

A base insulating layer 550 may be interposed between the base die 500 and the first semiconductor chip 100. Side surfaces of the base insulating layer 550 may be covered with a first molding member 150.

The base die 500 may be a dummy semiconductor chip, for example, not including individual devices included in the first to fourth semiconductor chips 100, 200, 300, and 400. The base die 500 may be a buffer die which may receive at least one of a control signal, a power signal, and a ground signal for operations of the first to fourth semiconductor chips 100, 200, 300, and 400 from an external entity through the base through-electrode 530 and the interlayer insulating layer 520, may receive a data signal to be stored in the first to fourth semiconductor chip 100, 200, 300, and 400 from an external entity through the base through-electrode 530 and the interlayer insulating layer 520, and/or may provide data, stored in the first to fourth semiconductor chip 100, 200, 300, and 400, to an external entity through the base through-electrode 530 and the interlayer insulating layer 520.

The first to fourth semiconductor chip 100, 200, 300, and 400 may be stacked on the base die 500 having a through-electrode 530 having the same or similar structure as the first to fourth semiconductor chips 100, 200, 300, and 400. Accordingly, connection members 140, 240, 340, and 440 of the first to fourth semiconductor chips 100, 200, 300, and 400 are surrounded by a first molding member 150 and are not exposed outwardly of the semiconductor package 2a. As a result, damage may be prevented during movement or storage of the semiconductor package 2a.

For example, the semiconductor package 2a, illustrated in FIG. 8, may include a base die 500 (hereinafter, may be referred to as a "substrate"), a plurality of semiconductor chips 100, 200, 300, and 400 mounted on the base die 500 and stacked in one direction, inter-chip insulating layers 250, 350, and 450, respectively disposed between the plurality of semiconductor chips 100, 200, 300, and 400, and base insulating layers 550 between a lowermost semiconductor chip 100, among the plurality of semiconductor chips 100, 200, 300, and 400, and the base die 500. A horizontal width of the base die 500 may be greater than a horizontal width of each of the first to fourth semiconductor chip 100, 200, 300, and 400. The first molding member 150 may be on and/or cover side surfaces of the plurality of semiconductor chips 100, 200, 300, and 400, side surfaces of the inter-chip insulating layers 250, 350, and 450 and the base insulating layers 550, and an upper surface of the base die 500. Among the elements illustrated in FIG. 8, components having the same reference numerals in FIG. 1 are similar to those shown in FIG. 1, and thus, descriptions thereof will be omitted.

Figure 9:
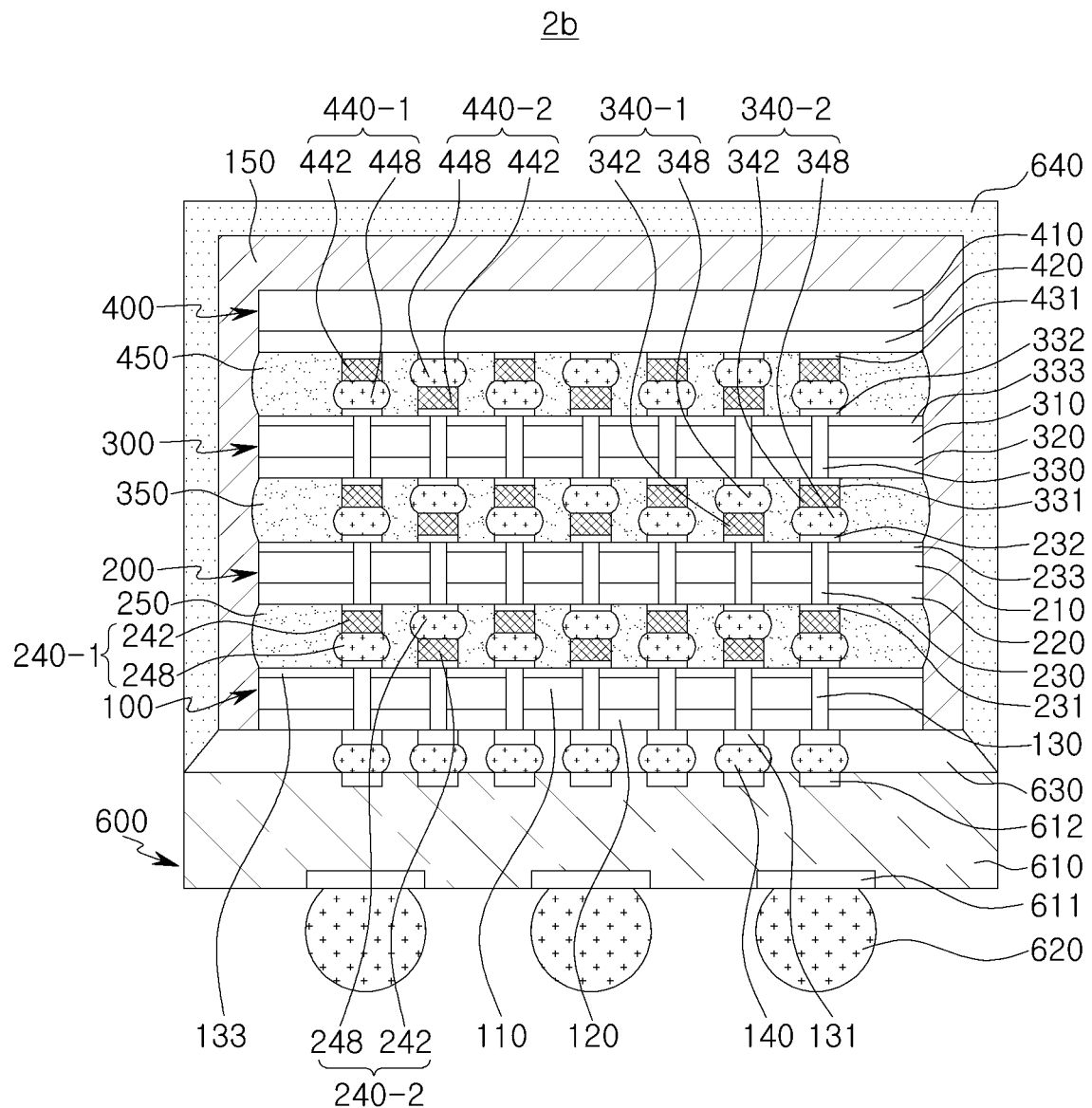
FIG. 9 is a cross-sectional view of a semiconductor package according to an example embodiment.

FIG. 9 is a cross-sectional view of a semiconductor package 2b according to an example embodiment.

Referring to FIG. 9, the semiconductor package 2b according to an example embodiment may include a base substrate 600 and first to fourth semiconductor chips 100, 200, 300, and 400 mounted on the base substrate 600 and sequentially stacked on an upper surface of the base substrate 600.

The base substrate 600 may be or include, for example, a printed circuit board, a ceramic substrate, or an interposer. When the base substrate 600 is a printed circuit board, the base substrate 600 may include a substrate body 610, a lower pad 611, an upper pad 612, and solder resist layers, not illustrated, disposed on a lower surface and an upper surface of the substrate body 610. An internal wiring, not illustrated, may be disposed in the substrate body 610 to electrically connect the lower pad 611 and the upper pad 612 to each other. The lower pad 611 and the upper pad 612 may be portions exposed by the solder resist layers disposed on the lower surface and the upper surface of the substrate body 610 among the circuit wirings patterned after coating a copper (Cu) foil on the lower surface and the upper surface of the substrate body 610, respectively.

When the base substrate 600 is an interposer, the base substrate 600 may include a substrate body 610, formed of a semiconductor material, and a lower pad 611 and an upper pad 612, respectively disposed on a lower surface and an upper surface of the substrate body 610. The substrate body 610 may be formed from, for example, a silicon wafer. In addition, an internal wiring, not illustrated, may be formed on the lower surface, the upper surface, or inside of the substrate body 610. In addition, a through-via, not illustrated, may be formed in the substrate body 610 to electrically connect the lower pad 611 and the upper pad 612.

An external connection terminal 620 may be attached to the lower surface of the base substrate 600. The external connection terminal 620 may be attached onto, for example, the lower pad 611. The external connection terminal 620 may be, for example, a solder ball or a bump. The external connection terminal 620 may electrically connect the semiconductor package 2b to an external device. At least a portion of the external connection terminals 620 may be disposed in a fan-out region, not overlapping the first to fourth semiconductor chips 100, 200, 300, and 400 in a vertical direction.

A first molding member 150 and a second molding member 640 may be disposed on the base substrate 600. The first molding member 150 may surround at least side surfaces of the first to fourth semiconductor chips 100, 200, 300, and 400. The second molding member 640 may surround at least a side surface of the first molding member 150 and may not be in direct contact with the side surfaces of the first to fourth semiconductor chips 100, 200, 300, and 400. The first and second molding members 150 and 640 may be formed of, for example, an epoxy mold compound.

An underfill material layer 630 may be formed between the base substrate 600 and the first semiconductor chip 100. The underfill material layer 630 may be interposed between the base substrate 600 and the first semiconductor chip 100 to surround a side surface of the external connection member 140. The underfill material layer 630 may be formed of, for example, an epoxy resin. The underfill material layer 630 may be a portion of the second molding member 640 formed in a molded underfill (MUF) manner. Among the elements illustrated in FIG. 9, components having the same reference numerals in FIG. 1 are similar to those shown in FIG. 1, and thus, descriptions thereof will be omitted.

Figure 10:
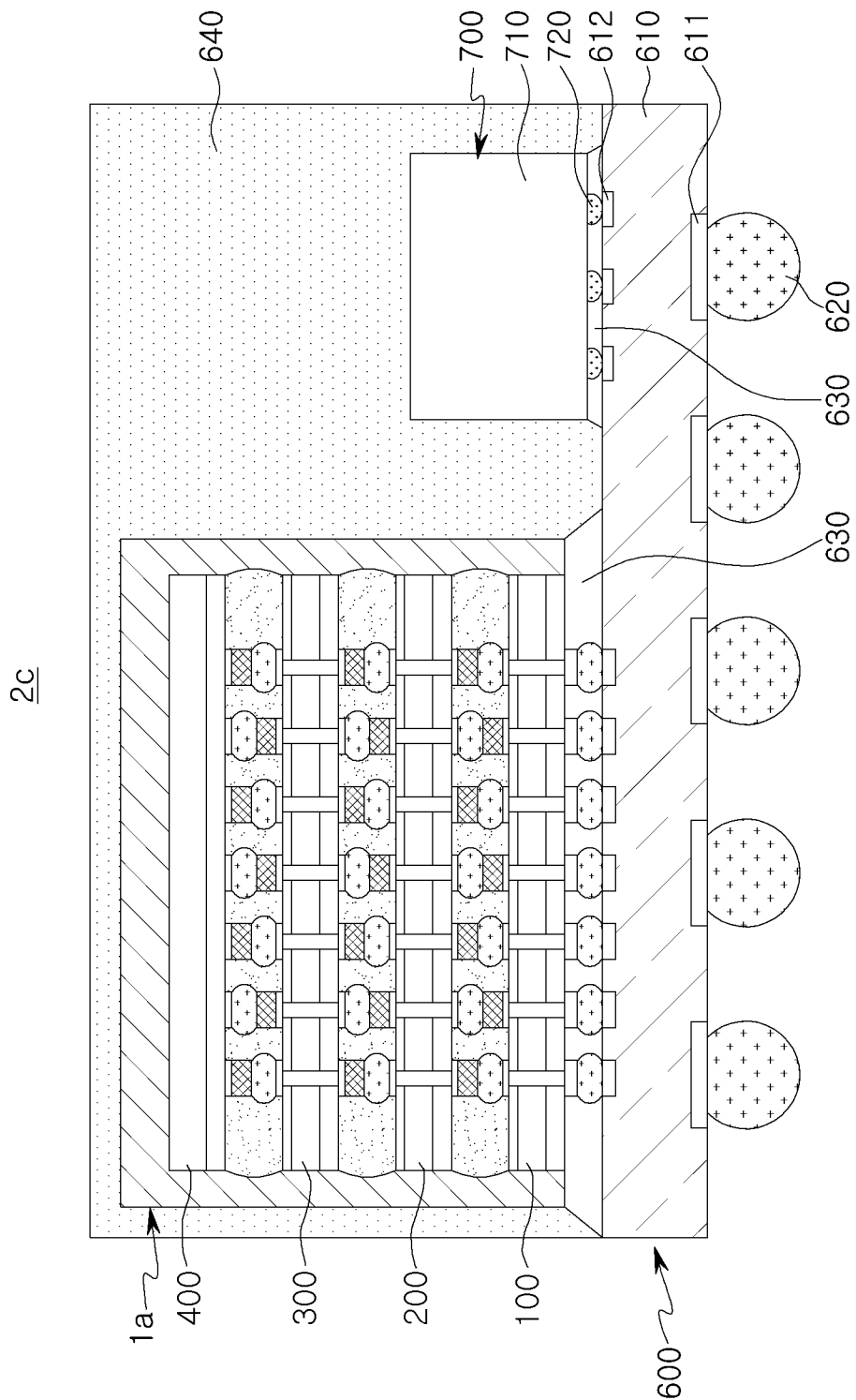
FIG. 10 is a cross-sectional view of a semiconductor package according to an example embodiment.

FIG. 10 is a cross-sectional view of a semiconductor package 2c according to an example embodiment.

Referring to FIG. 10, the semiconductor package 2c according to an example embodiment may include a main semiconductor chip 700, attached onto a base substrate 600, and a semiconductor package including first to fourth semiconductor chips 100, 200, 300, and 400 sequentially stacked on the base substrate 600, such as semiconductor package 1a illustrated in FIG. 1. Though FIG. 10 illustrates the embodiment of semiconductor package 1a on the base substrate 600, it will be understood that other semiconductor packages including stacked semiconductor chips, such as those shown with regard to semiconductor packages 1b, 1c, 1d, 1e, and 1f may be incorporated in semiconductor package 2c without deviation from the inventive concepts.

The main semiconductor chip 700 may be a processor unit. The main semiconductor chip 700 may be, for example, a microprocessor unit (MPU) or a graphics processor unit (GPU). The main semiconductor chip 700 may be a package in which a normal operation is verified, for example, a known good package (KGP). A main connection terminal 720 may be attached to a lower surface of a main body 710 of the main semiconductor chip 700.

An underfill material layer 630 may be formed in a space between the base substrate 600 and the first semiconductor chip 100 and a space between the base substrate 600 and the main semiconductor chip 700.

The second molding member 640 may cover an upper surface of the base substrate 600, a side surface and an upper surface of the main semiconductor chip 700, and at least a side surface of a first molding member surrounding the first to fourth semiconductor chips 100, 200, 300, and 400.

In some embodiments, the underfill material layer 630 disposed between the base substrate 600 and the first semiconductor chip 100 and between the base substrate 600 and the main semiconductor chip 700 may be a portion of the second molding member 640.

FIGS. 11 to 18 are schematic cross-sectional views illustrating a method of manufacturing a semiconductor package according to an example embodiment.

Figure 11:
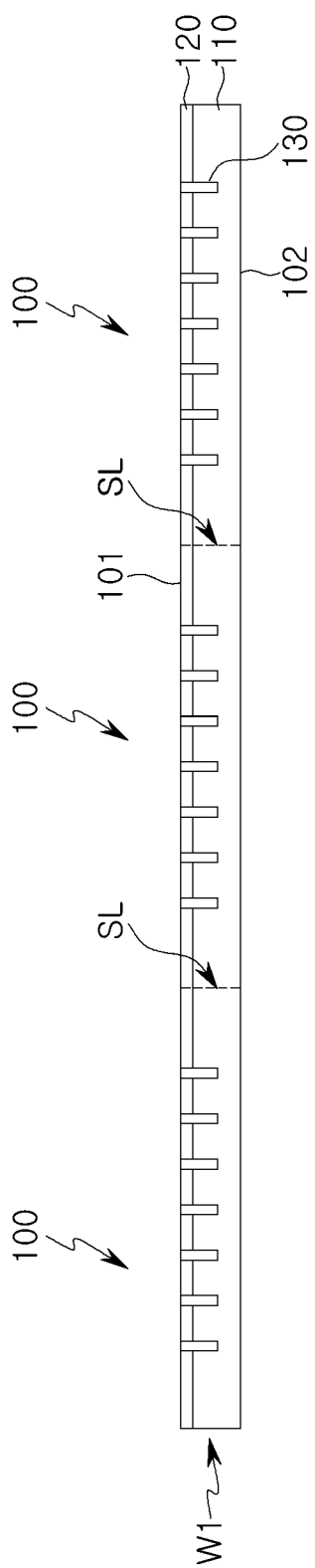
FIGS. 11 to 18 are schematic cross-sectional views illustrating a method of manufacturing a semiconductor package according to an example embodiment.

Referring to FIG. 11, a first semiconductor wafer W1 is prepared. The semiconductor wafer W1 may include a plurality of first semiconductor chips 100 divided into scribe lanes SL. A first semiconductor chip 100 includes a first semiconductor substrate 110, a first semiconductor element layer 120, and a first through-electrode 130. The first semiconductor substrate 110 may have a first upper surface 101 and a first lower surface 102 opposing each other. The first semiconductor element layer 120 may be formed on the first upper surface 101 of the first semiconductor substrate 110. The first through-electrode 130 may be formed to extend into the first semiconductor substrate 110 through the first semiconductor element layer 120 from the first upper surface 101 of the first semiconductor substrate 110.

The first semiconductor element layer 120 may include a system LSI, a flash memory, a DRAM, an SRAM, an EEPROM, a PRAM, an MRAM, or an RRAM, and may be formed to include a plurality of wiring structures for connecting a plurality of individual elements to other wirings formed in the first semiconductor substrate 110.

The first through-electrode 130 may extend into the first semiconductor substrate 110 from the first upper surface 101 of the first semiconductor substrate 110. At least a portion of the first through-electrode 130 may have a pillar shape. The first through-electrode 130 may include a barrier layer, formed on a pillar-shaped surface, and a buried conductive layer filling inside of the barrier layer. A via insulating layer may be interposed between the first semiconductor substrate 110 and the first through-electrode 130. The via insulating layer may be formed of, for example, an oxide, a nitride, a carbide, a polymer, or combinations thereof.

The first through-electrode 130 may be formed of conductive materials penetrating through the first semiconductor substrate 110 having a portion removed in a subsequent process. For example, the first through-electrode 130 may include a barrier layer and a buried conductive layer inside of the barrier layer. In some embodiments, for example, the first through-electrode 130 may be formed as a portion of a barrier layer, a buried conductive layer filling the barrier layer, and a metal wiring layer and/or a via plug.

Figure 12:
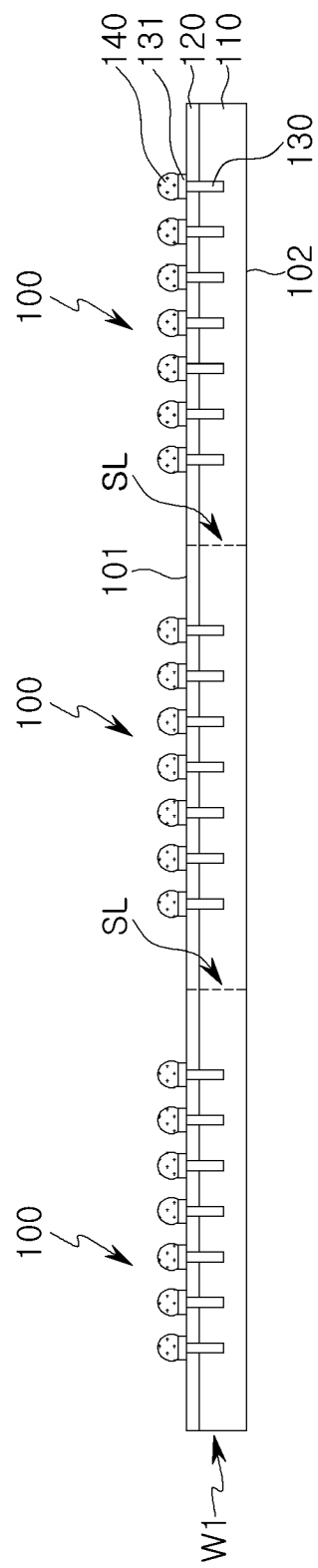

Referring to FIG. 12, a first lower connection pad 131 is formed on the first semiconductor substrate 110 to be electrically connected to the first through-electrode 130, and an external connection member 140 may be formed on the first lower connection pad 131. In example embodiments, the first lower connection pad 131 may be omitted.

The external connection member 140 may be a common conductive bump. To form the external connection member 140, a mask pattern, not illustrated, having an opening, not illustrated, exposing a portion of the first lower connection pad 131, may be formed on the first semiconductor element layer 120. Then, the external connection member 140 may be formed on a portion of the first lower connection pad 131 exposed by the mask pattern. The external connection member 140 may be formed by an electroplating process. The mask pattern, not illustrated, may be removed and a thermal compression bonding process may be performed to form the external connection member 140 having a convex shape.

Figure 13:
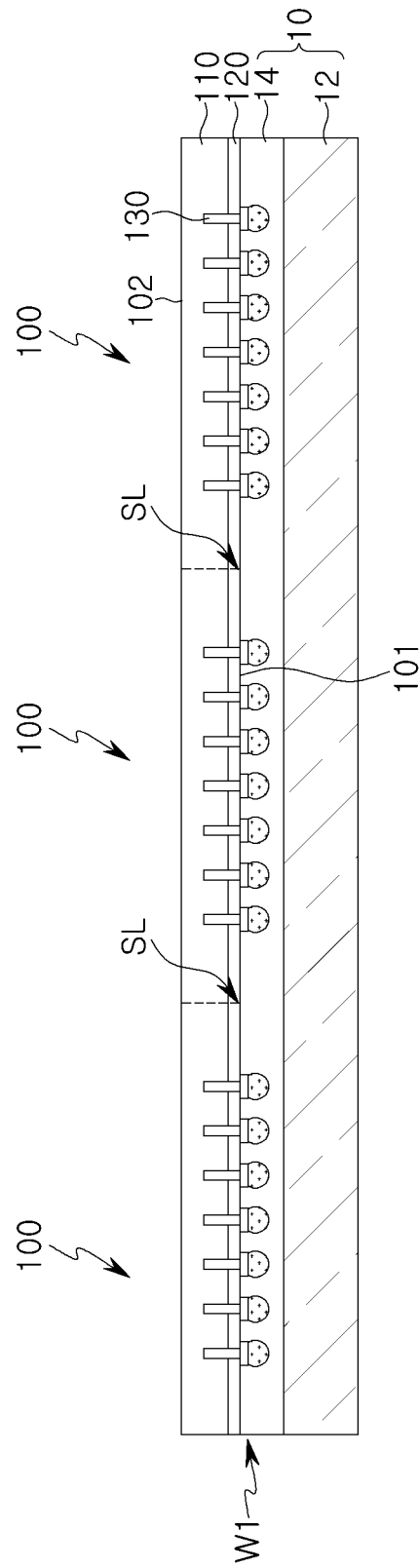

Referring to FIG. 13, the first semiconductor wafer W1, on which the external connection member 140 is formed, is attached to a first carrier substrate 10. The first carrier substrate 10 may include a first support substrate 12 and a first adhesive material layer 14. The first semiconductor wafer W1 may be attached to the first carrier substrate 10 such that an external connection member 140 faces the first carrier substrate 10. The external connection member 140 may be covered with the first adhesive material layer 14. A portion of the first semiconductor element layer 120 adjacent the first upper surface 101 of the first semiconductor substrate 110, exposed by the external connection member 140, may be in contact with the first adhesive material layer 14.

Figure 14:
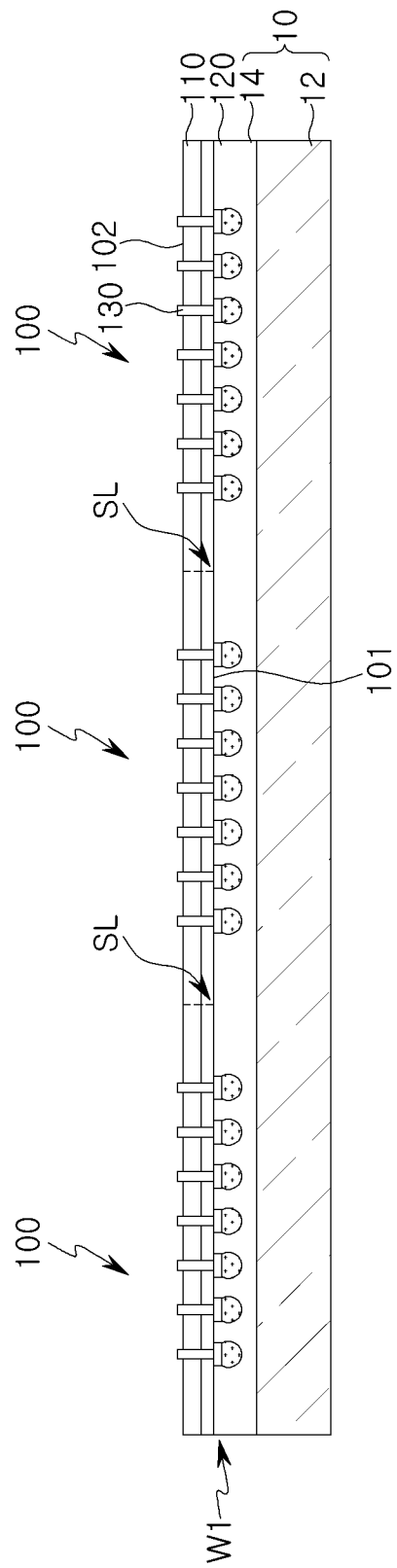

Referring to FIG. 14, a portion of the first semiconductor substrate 110 is removed to expose the first through-electrode 130. The first through-electrode 130 may be exposed to a first lower surface 102 of the first semiconductor substrate 110. Since the first through-electrode 130 is exposed to the first lower surface 102 of the first semiconductor substrate 110, the first through-electrode 130 may have a shape penetrating through the first semiconductor substrate 110. Optionally, a portion of the first semiconductor substrate 110 may be removed such that the first through-electrode 130 protrudes further than the first lower surface 102.

A portion of the first semiconductor substrate 110 may be removed using a chemical mechanical polishing (CMP) process, an etch-back process, or a combination thereof to expose the first through-electrode 130.

Figure 15:
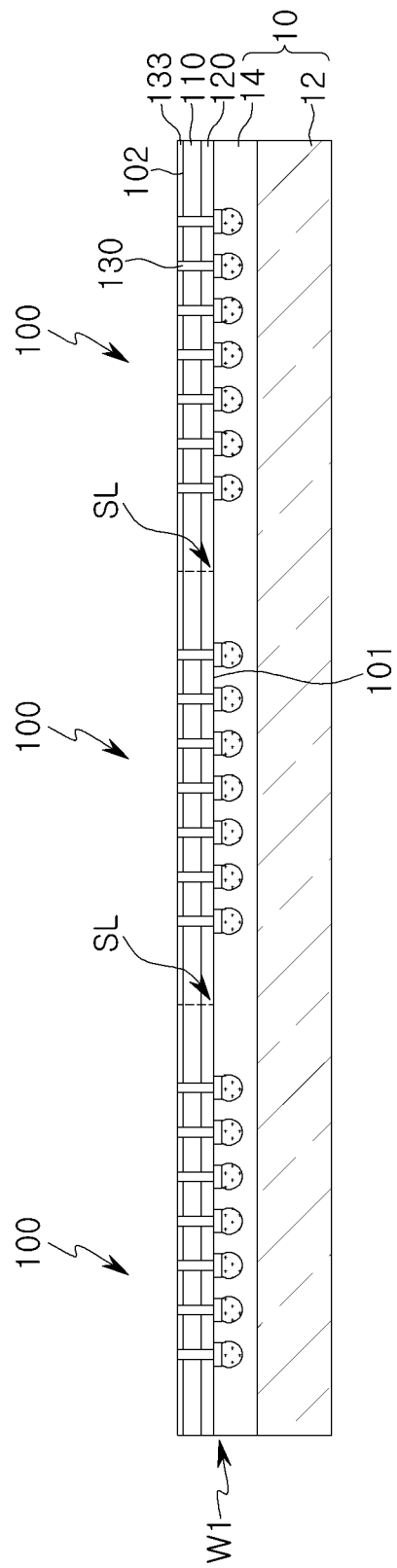

Referring to FIG. 15, a first rear surface passivation layer 133 may be formed to cover an exposed surface of the first semiconductor wafer W1, for example, the first lower surface 102 of the first semiconductor substrate 110. The first rear surface passivation layer 133 may be formed by, for example, a spin coating process or a spray process. The first rear surface passivation layer 133 may be formed of, for example, an insulating polymer. To form the first rear surface passivation layer 133, an insulating polymer layer may be formed to cover the first lower surface 102 of the semiconductor substrate 110 and the exposed first through-electrode 130, and then a portion of the insulating polymer layer may be removed by an etch-back process to expose the first through-electrode 130.

Figure 16:
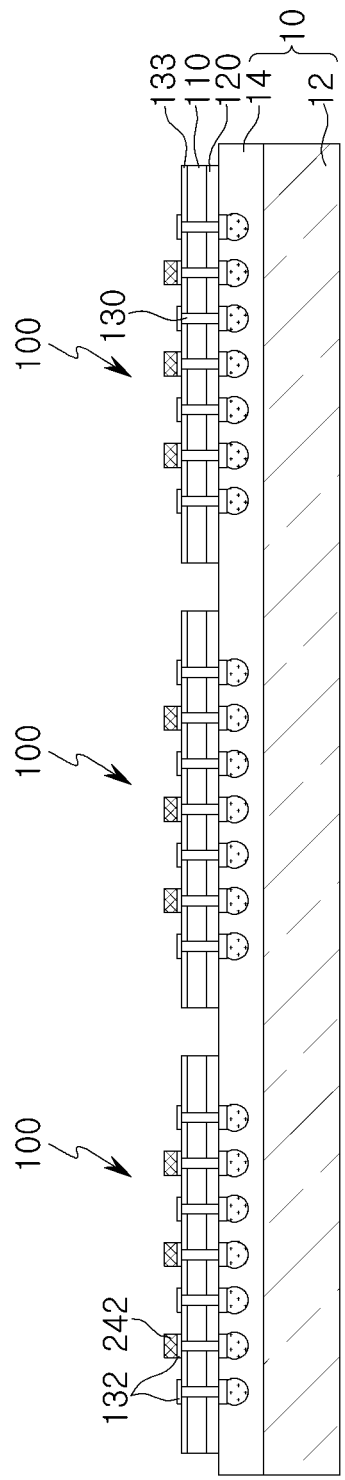

Referring to FIG. 16, a first upper connection pad 132 is formed to be electrically connected to the portion of the first through-electrode 130 exposed by the first rear surface passivation layer 133. Optionally, the first upper connection pad 132 may be omitted so as not to be formed. A pillar 242 is formed on the first upper connection pads 132, but is not formed on the first upper connection pads 132 on opposite sides adjacent to the first upper connection pads 132 on which the pillar 242 is formed. For example, the pillar 242 is formed on the first upper connection pads 132 to have a stepping stone. For example, the pillar 242 may be formed on every other one of the first upper connection pads 132. The pillar 242 may be formed by performing, once or several times, a process of performing electroplating after forming a photoresist layer, not illustrated, on the first rear surface passivation layer 133 and etching a photoresist layer, not illustrated, on the first upper connection pad 132.

The semiconductor wafer (W1 in FIG. 15) may be cut along the scribe lanes (SL in FIG. 15) using a sawing blade, not illustrated, to be divided into a plurality of first semiconductor chips 100. The divided first semiconductor chips 100 may be disposed side by side in a horizontal direction.

Figure 17:
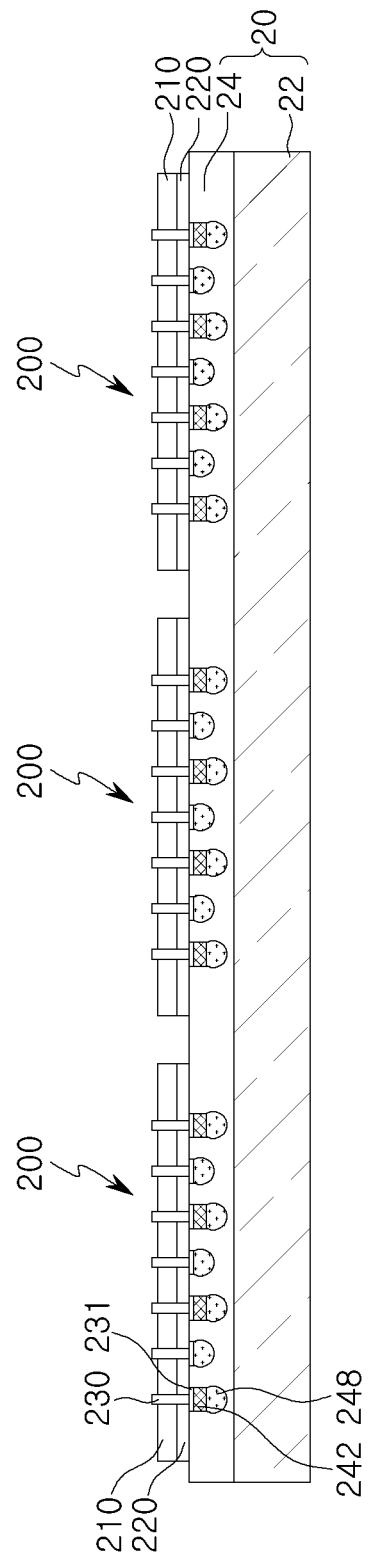

Referring to FIG. 17, second semiconductor chips 200 may be prepared to be stacked on the first semiconductor chip 100. To prepare the second semiconductor chips 200, a second semiconductor wafer, not illustrated, may processed similarly to the first semiconductor wafer W1 illustrated in FIGS. 11 to 16. The processed second semiconductor wafer, not illustrated, may be divided to prepare the second semiconductor chips 200.

The second semiconductor wafer may be a semiconductor wafer including individual homogenous elements formed through the same or similar process as the first semiconductor wafer W1. For example, a plurality of second semiconductor chips 200 may be attached to the second carrier substrate 20 in the form of the second semiconductor wafer connected to each other, and may then be cut to be divided into the second semiconductor chips 200. The second semiconductor chip 200 may include a second semiconductor substrate 210, a second semiconductor element layer 220, a second through-electrode 230, a second lower connection pad 231, a pillar 242, and a conductive bump 248. The second carrier substrate 20 may include a second support substrate 22 and a second adhesive material layer 24.

In particular, a pillar 242 and a conductive bump 248 may be formed below the second semiconductor chips 200. The pillar 242 and the conductive bump 248 may be formed on a lower surface of the second lower connection pad 231. The pillar 242, formed below the second semiconductor chips 200, may be disposed to correspond to first upper connection pads 132 (e.g., of the first semiconductor chip 100), on which the pillar 242 is not formed, among the first upper connection pads 132 of the above-described first semiconductor chips 100. For example, the pillar 242 is formed on the second lower connection pad 231 by a method similar to the method of manufacturing the first semiconductor chips 100, but is not formed on the second lower connection pad 231 on opposite sides adjacent to the second lower connection pad 231 on which the pillar 242 is formed. For example, the pillar 242 is formed on the second lower connection pads 231 in the form of a stepping stone. For example, the pillar 242 is formed on every other one of the second lower connection pads 231.

Figure 18:
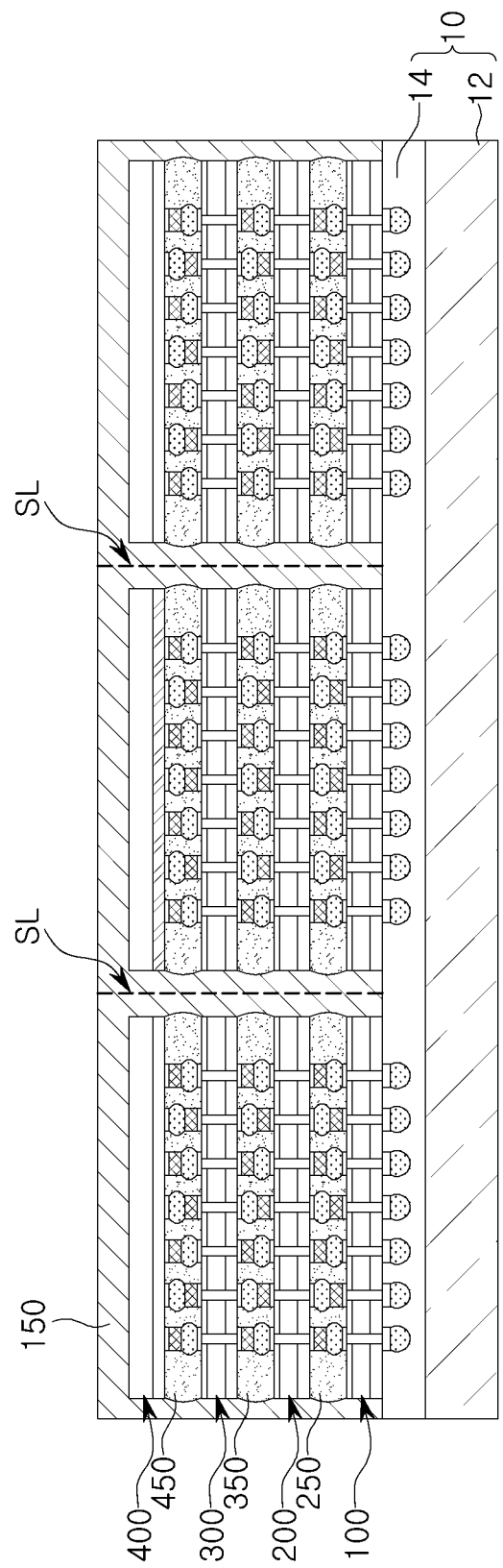

Referring to FIG. 18, second semiconductor chips 200, third semiconductor chips 300, and fourth semiconductor chips 400 may be sequentially stacked on the first semiconductor chips 100. The third to fourth semiconductor chips 300 and 400 may be prepared in the same or similar manner as the second semiconductor chips 200. In addition, the third to fourth semiconductor chips 300 and 400 may be prepared while lower surfaces of the third to fourth semiconductor chips 300 and 400 are provided with pillars and conductive bumps.

After the first to fourth semiconductor chips 100, 200, 300, and 400 are stacked, insulating layers 250, 350, and 450 may be attached to upper surfaces of underlying semiconductor chips by performing a reflow process and/or a thermal compression bonding process, respectively.

A first molding member 150 may be formed on the first carrier substrate 10 to be on and/or cover the first to fourth semiconductor chips 100, 200, 300, and 400. The first molding member 150 may be formed to be on and/or cover side surfaces of the first to third semiconductor chips 100, 200, and 300 and a side surface and an upper surface of the fourth semiconductor chip 400. The first molding member 150 may cover side surfaces of the insulating layers 250, 350, and 450 disposed between the first to fourth semiconductor chips 100, 200, 300, and 400. The first molding member 150 may include, for example, an epoxy mold compound (EMC). Then, a semiconductor wafer may be cut along scribe lane SL to be divided into semiconductor packages, each including the first to fourth semiconductor chips 100, 200, 300, and 400 corresponding to each other.

As described above, according to example embodiments, fine-pitch bumps may be disposed on different levels with respect to each other to provide a semiconductor package that has improved reliability and is capable of achieving miniaturization, high performance, and high capacity.

While example embodiments have been shown and described above, it will be apparent to those skilled in the art that modifications and variations could be made without departing from the scope of the present inventive concepts as defined by the appended claims.

What is claimed is:

1. A semiconductor package comprising:
    a first semiconductor chip comprising at least two first through-electrodes and at least two first upper connection pads that are respectively electrically connected to the at least two first through-electrodes and that are on an upper surface of the first semiconductor chip;
    a second semiconductor chip on the first semiconductor chip and comprising at least two second lower connection pads on a lower surface of the second semiconductor chip;
    a first connection member between the first semiconductor chip and the second semiconductor chip and comprising a first pillar and a first conductive bump, the first connection member electrically connecting a first one of the at least two first upper connection pads and a first one of the at least two second lower connection pads to each other; and
    a second connection member that is adjacent the first connection member and comprising a second pillar and a second conductive bump, the second connection member electrically connecting a second one of the at least two first upper connection pads and a second one of the at least two second lower connection pads to each other,
    wherein a first level of the first conductive bump and a second level of the second conductive bump are different, and
    wherein a third level of the first pillar and a fourth level of the second pillar are different.

2. The semiconductor package of claim 1, wherein in the first connection member, the first pillar is between the first conductive bump and the second semiconductor chip, and
    wherein, in the second connection member, the second pillar is between the second conductive bump and the first semiconductor chip.

3. The semiconductor package of claim 1, wherein each of the first pillar and the second pillar has a height of 5 to 13 μm.

4. The semiconductor package of claim 1, wherein a distance between the first connection member and the second connection member is 18 μm or less.

5. The semiconductor package of claim 1, wherein the first pillar comprises a first contact layer and a first support layer on the first contact layer,
    wherein the first contact layer contacts the first conductive bump and the first support layer is between the first contact layer and the first one of the at least two second lower connection pads,
    wherein the second pillar comprises a second contact layer and a second support layer on the second contact layer, and
    wherein the second contact layer contacts the second conductive bump and the second support layer is between the second contact layer and the second one of the at least two first upper connection pads.

6. The semiconductor package of claim 5, wherein the first and second contact layers comprise nickel, and
    wherein the first and second support layers comprise copper.

7. The semiconductor package of claim 5, wherein the first pillar further comprises a first base layer on the first support layer and contacting the first one of the at least two second lower connection pads,
    wherein the second pillar comprises a second base layer on the second support layer and contacting the second one of the at least two first upper connection pads, and
    wherein the first base layer and the second base layer comprise nickel.

8. The semiconductor package of claim 1, wherein the first connection member further comprises a first auxiliary pillar on an opposite side of the first conductive bump from the first pillar,
    wherein the second connection member further comprises a second auxiliary pillar on an opposite side of the second conductive bump from the second pillar, and
    wherein the first auxiliary pillar and the second auxiliary pillar are at different levels with respect to each other.

9. The semiconductor package of claim 8, wherein the first auxiliary pillar contacts a lower surface of the first conductive bump and the first one of the at least two first upper connection pads,
    wherein the second auxiliary pillar contacts an upper surface of the second conductive bump and the second one of the at least two second lower connection pads, and
    wherein each of the first and second auxiliary pillars has a height less than a height of each of the first and second pillars.

10. The semiconductor package of claim 9, wherein each of the first and second auxiliary pillars has a height of 1 to 3 μm.

11. The semiconductor package of claim 1, further comprising:
    a molding member on a side surface of the first semiconductor chip and a side surface of the second semiconductor chip.

12. The semiconductor package of claim 1, wherein one of the at least two first through-electrodes is electrically connected to at least one of the first connection member and the second connection member.

13. A semiconductor package comprising:
- a first semiconductor chip comprising a plurality of first through-electrodes and a plurality of first upper connection pads respectively electrically connected to the plurality of first through-electrodes, wherein the plurality of first upper connection pads are on an upper surface of the first semiconductor chip;
- a second semiconductor chip on the first semiconductor chip and comprising a plurality of second lower connection pads on a lower surface of the second semiconductor chip; and
- a plurality of connection members, each including a pillar and a conductive bump, the plurality of connection members electrically connecting respective ones of the first upper connection pads and the second lower connection pads to each other,
- wherein respective conductive bumps of adjacent connection members, among the plurality of connection members, are alternately disposed at different levels with respect to the upper surface of the first semiconductor chip, and
- wherein respective pillars of adjacent connection members, among the plurality of connection members, are alternately disposed at different levels with respect to the upper surface of the first semiconductor chip.

14. The semiconductor package of claim 13, further comprising:
- an insulating layer between the first semiconductor chip and the second semiconductor chip and on the plurality of connection members.

15. The semiconductor package of claim 14, further comprising:
- a first molding member on a side surface of the first semiconductor chip, a side surface of the second semiconductor chip, and a side surface of the insulating layer.

16. The semiconductor package of claim 15, further comprising:
- a substrate having an upper surface on which the first semiconductor chip is mounted; and
- a second molding member on the substrate and covering at least a side surface of the first molding member.

17. The semiconductor package of claim 13, wherein the pillar comprises a contact layer contacting the conductive bump and comprising nickel, a support layer stacked on the contact layer and comprising copper, and a base layer stacked on the support layer and comprising nickel.

18. The semiconductor package of claim 13, wherein each of the plurality of connection members further comprises an auxiliary pillar on an opposite side of the conductive bump from the pillar.

19. The semiconductor package of claim 13, wherein a distance between adjacent ones of the connection members is 18 μm or less.

20. A semiconductor package comprising:
- a first semiconductor chip comprising a first through-electrode, a first upper connection pad connected to the first through-electrode, a second through-electrode, and a second upper connection pad connected to the second through-electrode, wherein the first upper connection pad and the second upper connection pad are on an upper surface of the first semiconductor chip;
- a second semiconductor chip on the first semiconductor chip and including a first lower connection pad and a second lower connection pad on a lower surface of the second semiconductor chip;
- a first connection member comprising a first conductive bump having a lower surface facing the first semiconductor chip and an upper surface opposite the lower surface, a first auxiliary pillar on the lower surface of the first conductive bump and contacting the first upper connection pad, and a first pillar on the upper surface of the first conductive bump and contacting the first lower connection pad;
- a second connection member comprising a second conductive bump having a lower surface facing the first semiconductor chip and an upper surface opposite the lower surface, a second pillar on the lower surface of the second conductive bump and contacting the second upper connection pad, and a second auxiliary pillar on the upper surface of the second conductive bump and contacting the second lower connection pad; and
- an insulating layer between the first semiconductor chip and the second semiconductor chip and on the first connection member and the second connection member,
- wherein the first conductive bump is at a level that is lower than a level of the second conductive bump.

* * * * *